(12) United States Patent
Moon (10) Patent No.: US 8,987,719 B2
(45) Date of Patent: Mar. 24, 2015

(54) ORGANIC LIGHT EMITTING DIODE DISPLAY

(71) Applicant: Samsung Display Co., Ltd., Yongin, Gyeonggi-Do (KR)

(72) Inventor: Sung-Hoon Moon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/905,990

(22) Filed: May 30, 2013

(65) Prior Publication Data

US 2014/0077180 A1 Mar. 20, 2014

(30) Foreign Application Priority Data

Sep. 18, 2012 (KR) .................. 10-2012-0103216

(51) Int. Cl.
| H01L 29/16 | (2006.01) |
| H01L 29/786 | (2006.01) |
| H01L 51/50 | (2006.01) |
| H01L 51/52 | (2006.01) |
| H01L 27/12 | (2006.01) |
| G09G 3/32 | (2006.01) |

(52) U.S. Cl.
CPC ........ H01L 51/5296 (2013.01); H01L 27/1214 (2013.01); G09G 3/3225 (2013.01); H01L 51/52 (2013.01); G09G 2300/0426 (2013.01); G09G 2300/0861 (2013.01)

USPC ................... 257/40; 257/59; 257/61; 257/72; 257/392; 257/E33.015; 257/E33.004; 257/E29.275

(58) Field of Classification Search
None
See application file for complete search history.

(56) References Cited

U.S. PATENT DOCUMENTS

| 5,969,377 | A | * | 10/1999 | Seo ................................. 257/72 |
| 6,677,191 | B1 | | 1/2004 | Battersby |
| 7,910,919 | B2 | * | 3/2011 | Yang et al. ...................... 257/40 |
| 2006/0105514 | A1 | * | 5/2006 | Yamazaki et al. ............ 438/197 |
| 2008/0170010 | A1 | * | 7/2008 | Kim .............................. 345/76 |
| 2011/0090202 | A1 | * | 4/2011 | Han ............................ 345/211 |
| 2012/0199854 | A1 | * | 8/2012 | Noguchi ........................ 257/88 |
| 2013/0207117 | A1 | * | 8/2013 | An et al. ........................ 257/71 |

FOREIGN PATENT DOCUMENTS

| KR | 10-0477106 | 3/2005 |
| KR | 10-0841365 | 6/2008 |
| KR | 10-2011-0096337 | 8/2011 |

* cited by examiner

Primary Examiner — Joseph Schoenholtz
(74) Attorney, Agent, or Firm — Robert E. Bushnell, Esq.

(57) ABSTRACT

An organic light emitting diode (OLED) display includes: a substrate; an organic light emitting element formed on the substrate; a first thin film transistor connected to the organic light emitting element and including an amorphous silicon channel region; and at least one other thin film transistor connected to the first thin film transistor and including a polysilicon channel region.

10 Claims, 6 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 18 Sep. 2012 and there duly assigned Serial No. 10-2012-0103216.

BACKGROUND OF THE INVENTION

1. Field of the Invention

The described technology relates generally to an organic light emitting diode (OLED) display. More particularly, the described technology relates generally to an organic light emitting diode (OLED) display including a plurality of thin film transistors.

2. Description of the Related Art

Recently, organic light emitting diode (OLED) displays have received much attention as display devices for displaying images.

OLED displays have a self-emission characteristic, eliminating the necessity for a light source, unlike a liquid crystal display (LCD) device, and thus can be fabricated to be thinner and lighter. Also, the OLED display has high quality characteristics such as low power consumption, high luminance, a high response speed, and the like.

In general, the OLED display includes gate wires provided on a substrate and extended in one direction, data wires extended in a direction crossing the gate wires, a pixel circuit connected with the gate wires and the data wires and including a switching thin film transistor, a driving thin film transistor, one or more capacitors, and an organic light emitting diode connected with the pixel circuit.

However, recently, as a semiconductor characteristic of each channel of a plurality of thin film transistors is improved and each driving characteristics of a plurality of thin film transistor is improved, since a driving range (DR range) of a gate voltage applied to a gate electrode of a driving thin film transistor supplying a driving current to an organic light emitting element among a plurality of thin film transistor is very narrow, a grayscale of the light emitted from the organic emission layer included in the organic light emitting element by the driving current is narrow such that display quality of the organic light emitting diode (OLED) display is deteriorated.

The above information disclosed in this Background section is only for enhancement of understanding of the background of the described technology and therefore it may contain information that does not form the prior art that is already known in this country to a person of ordinary skill in the art.

SUMMARY OF THE INVENTION

An exemplary embodiment provides an organic light emitting diode (OLED) display with improved display quality by realizing abundant grayscales of light emitted from an organic emission layer.

An organic light emitting diode (OLED) display according to the present invention includes: a substrate; an organic light emitting element formed on the substrate; a first thin film transistor connected to the organic light emitting element and including an amorphous silicon channel region; and at least one other thin film transistor connected to the first thin film transistor and including a polysilicon channel region.

The amorphous silicon channel region and the polysilicon channel region may be positioned at the same layer.

A distance between the first gate electrode and the amorphous silicon channel region of the first thin film transistor may be longer than a distance between the gate electrode and the polysilicon channel region of at least one other thin film transistor.

A first scan line extending in a first direction on the substrate, a second scan line separated from the first scan line and extending in the first direction, an initialization power line separated from the second scan line and extending in the first direction, a light emission control line separated from the initialization power line and extending in the first direction, a data line extending in a second direction crossing the first direction on the substrate, and a driving power line separated from the data line and extending in the second direction may be further included.

The first scan line, the second scan line, the initialization power line, and the light emission control line may be positioned at the same layer.

The first scan line and the light emission control line may be positioned at the same layer, and the second scan line and the initialization power line may be positioned on the first scan line and the light emission control line via an insulation layer.

The other thin film transistor may be formed in plural, and a plurality of other thin film transistors may include: a second thin film transistor including a second gate electrode connected to the first scan line and connecting the data line and the first thin film transistor; a third thin film transistor including a third gate electrode connected to the first scan line and connecting the first thin film transistor and the first gate electrode of the first thin film transistor; a fourth thin film transistor including a fourth gate electrode connected to the second scan line and connecting the initialization power line and the first gate electrode; a fifth thin film transistor including a fifth gate electrode connected to the light emission control line and connecting the driving power line and the first thin film transistor; and a sixth thin film transistor including a sixth gate electrode connected to the light emission control line and connecting the first thin film transistor and the organic light emitting element.

The first gate electrode, the second gate electrode, the third gate electrode, the fourth gate electrode, the fifth gate electrode, and the sixth gate electrode may be formed at the same layer.

The fourth gate electrode, the fifth gate electrode, and the sixth gate electrode may be positioned at the same layer, and the first gate electrode, the second gate electrode, and the third gate electrode may be positioned at different layers on the fourth gate electrode, the fifth gate electrode, and the sixth gate electrode via an insulation layer.

A capacitor including a first capacitor electrode connected to the first gate electrode and positioned at the same layer as the fourth gate electrode, the fifth gate electrode, and the sixth gate electrode, and a second capacitor electrode connected to the driving power line and formed at the same layer as the first gate electrode, the second gate electrode, and the third gate electrode may be further included.

The organic light emitting element may include a first electrode connected to the first thin film transistor, an organic emission layer positioned on the first electrode, and a second electrode positioned on the organic emission layer.

According to an exemplary embodiment, the grayscales of the light emitted from the organic emission layer are sufficient such that an organic light emitting diode (OLED) display with improved display quality is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in several exemplary embodiments, constituent elements having the same construction are assigned the same reference numerals and are representatively described in connection with a first exemplary embodiment, and in the remaining exemplary embodiments, only different constituent elements from those of the first exemplary embodiment are described.

In addition, the size and thickness of each component shown in the drawings are arbitrarily shown for better understanding and ease of description, and the present invention is not limited thereto.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, file, region, or substrate is referred to as being "on" another element, it can be on the other element or under the other element. The element might not be on another element in a gravity direction.

Now, an organic light emitting diode (OLED) display according to the first exemplary embodiment will be described with reference to FIG. 1 to FIG. 3.

Figure 1:
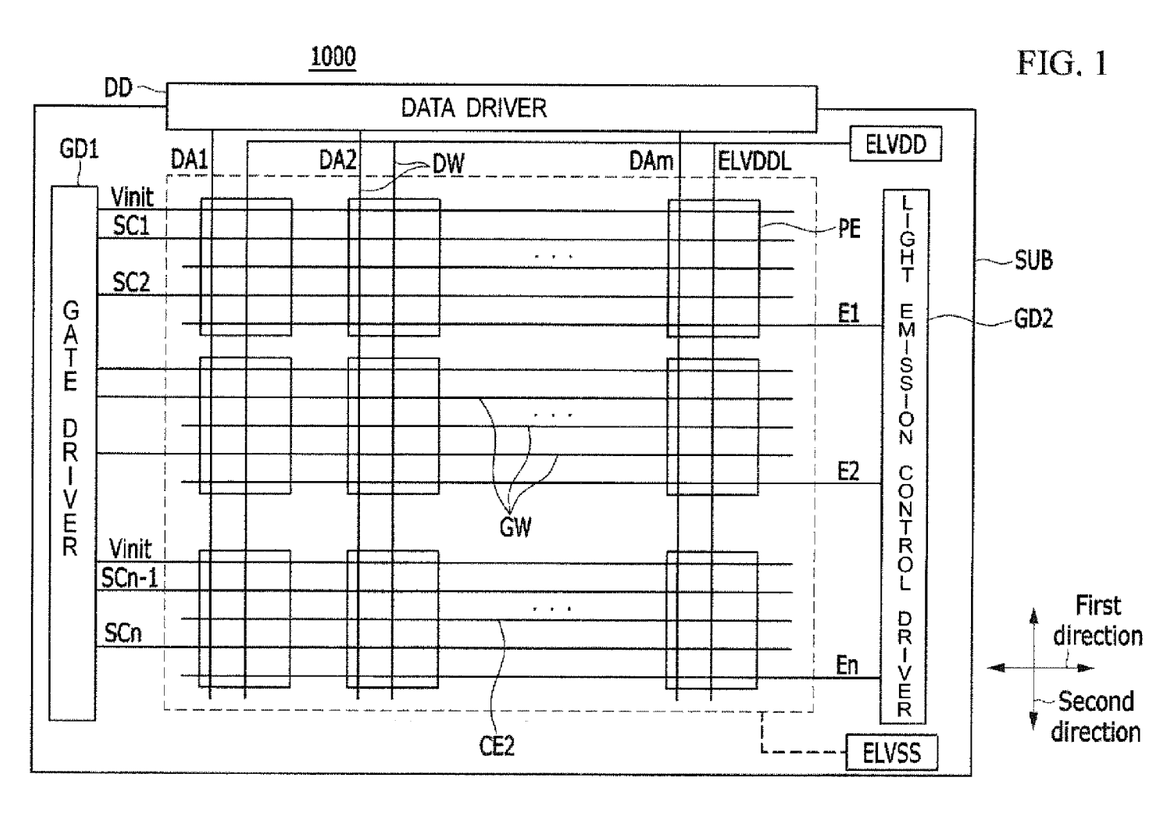
FIG. 1 is a view of an organic light emitting diode (OLED) display according to a first exemplary embodiment.

FIG. 1 is a view of an organic light emitting diode (OLED) display according to a first exemplary embodiment.

As shown in FIG. 1, an organic light emitting diode (OLED) display 1000 includes a gate driver GD1, gate wires GW, a light emission control driver GD2, a data driver DD, data wires DW, and pixels PE.

The gate driver GD1 sequentially supplies scan signals to the first scan lines SC1 through SCn-1 and the second scan lines SC2 through SCn included in the gate wires GW corresponding to an external control circuit (not shown), for example, a control signal supplied from a timing controller (not shown). Then, pixels PE are selected by the scan signal and sequentially receive data signals.

The gate wires GW are disposed on a substrate SUB and extended in a first direction. The gate wires GW include first scan lines SC1 through SCn-1, light emission control lines E1 through En, second scan lines SC2 through SCn, initialization power lines Vinit, and second capacitor electrodes CE2 that will be described later. The first scan lines SC1 through SCn-1 are connected to the gate driver GD1 and receive scan signals from the gate driver GD1. The light emission control lines E1 through En are connected to the light emission control driver GD2 and receive light emission control signals from the light emission control driver GD2. The second scan lines SC2 through SCn are connected to the gate driver GD1 and receive scan signals from the gate driver GD1. The initialization power lines Vinit are connected to the gate driver GD1 and receive initialization power from the gate driver GD1. The second capacitor electrodes CE2 are separated from the first scan lines SC1 through SCn-1 and also extends in the first direction on substrate SUB.

Thus, for example, in view of the above, the initialization power line Vinit, the first scan line SCn-1, the second capacitor electrode CE2, the second scan line SCn, and the light emission control line En are separated from each other and extend in the first direction. Also, the initialization power line Vinit, the first scan line SCn-1, the second capacitor electrode CE2, the second scan line SCn, and the light emission control line En may be formed with the same layer and the same material, and may be formed by one process such as a photolithography.

In the first exemplary embodiment, the initialization power lines Vinit receive initialization power from the gate driver GD1, whereas in another exemplary embodiment, the initialization power lines Vinit may be connected in an different configuration receiving the initialization power.

The light emission control driver GD2 sequentially supplies the light emission control signals to the light emission control lines E1 through En in response to a control signal (not shown) supplied from the outside such as from the timing controller (not shown). Thus, the light emitting of the pixels PE is controlled by the light emission control signal.

That is, the light emission control signal controls the light emitting time of the pixels PE. However, the light emission control driver GD2 may be omitted according to an inner structure of the pixel PE.

The data driver DD supplies data signals to data line DA1 through DAm among the data wires DW in response to a control signal (not shown) supplied from an external source such as a timing controller (not shown).

The data signals supplied to the data lines DA1 through DAm are supplied to the pixels PE selected by the scan signals when the scan signals are supplied to the scan lines SC1 through SCn. The pixels PE are charged with a voltage corresponding to their corresponding data signals and emit light with corresponding luminance.

The data wires DW are positioned over the gate wires GW and extend in the second direction crossing the first direction. The data wires DW include the data lines DA1 through DAm and driving power lines ELVDDL. The data lines DA1 through DAm are connected to the data driver DD and receive data signals from the data driver DD. The driving power lines ELVDDL are connected to the first power ELVDD that will be described later to the outside and receive the driving power from the first power ELVDD.

The pixels PE are positioned at a crossing region of the gate wires GW and the data wires DW and each pixel PE includes an organic light emitting element emitting light with a luminance corresponding to a driving current corresponding to a data signals, and includes a plurality of thin film transistors and at least one capacitor to control the respective driving current flowing to the organic light emitting element. The plurality of thin film transistors and the at least one capacitor are respectively connected to the gate wires GW and the data wires DW, and the organic light emitting element is connected to the plurality of thin film transistors and the at least one capacitor, the organic light emitting element being connected between the first power ELVDD and a second power ELVSS.

Figure 2:
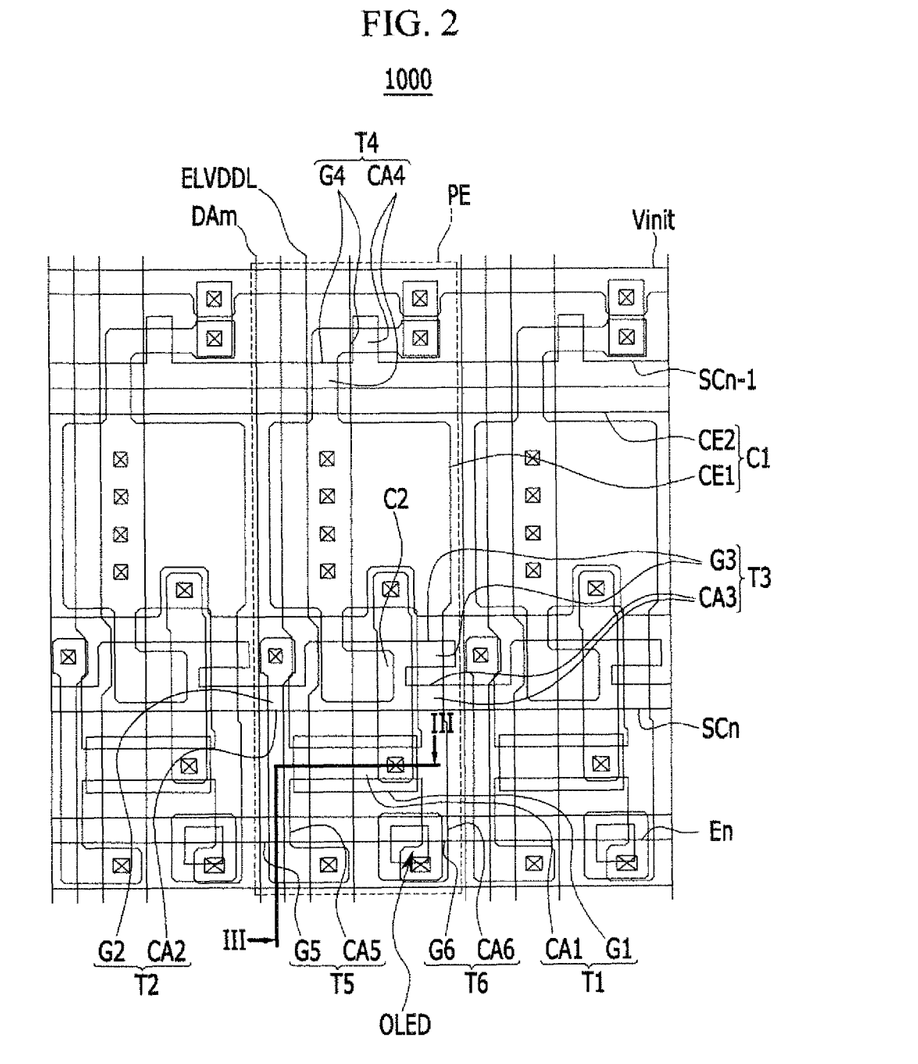
FIG. 2 is a layout view of a pixel portion shown in FIG. 1.

FIG. 2 shows a layout view for indicating a pixel part shown in FIG. 1. FIG. 3 is a cross-sectional view taken along the line III-III of FIG. 2.

As shown in FIG. 2, The pixel PE includes an organic light emitting element (OLED) connected between the first power ELVDD (not shown) and the second power ELVSS (not shown), and a pixel circuit including six thin film transistors T1 through T6 and two capacitors C1, C2 connected between the organic light emitting element (OLED) and the first power ELVDD (not shown) and controlling driving power supplied with the organic light emitting element (OLED).

Figure 3:
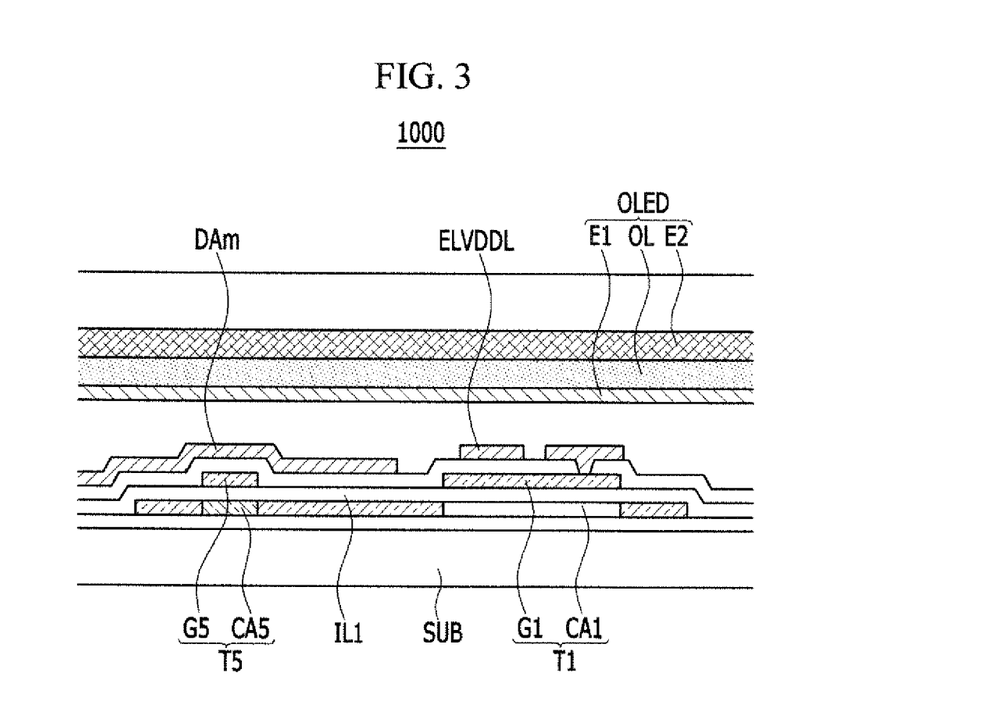
FIG. 3 is a cross-sectional view taken along the line III-III of FIG. 2.

As shown in FIG. 2 and FIG. 3, the organic light emitting element (OLED) includes the first electrode E1, an organic emission layer (OL) positioned on the first electrode E1, and the second electrode E2 positioned on the organic emission layer (OL). The first electrode E1 as an anode of the organic light emitting element (OLED) is connected to the driving power line ELVDDL connected to the first power ELVDD (not shown) through the pixel circuit, and the second electrode E2 as a cathode of the organic light emitting element (OLED) is connected to the second power ELVSS (not shown). The organic emission layer (OL) of the organic light emitting element (OLED) is supplied with the driving power through the first power ELVDD (not shown), and the light is emitted with the luminance corresponding to the driving current flowing to the organic light emitting element (OLED) when supplying a common power from the second power ELVSS (not shown).

The pixel circuit includes the first thin film transistor T1, the second thin film transistor T2, the third thin film transistor T3, the fourth thin film transistor T4, the fifth thin film transistor T5, the sixth thin film transistor T6, the first capacitor C1, and the second capacitor C2.

The first thin film transistor T1 is connected between the driving power line ELVDDL and the first electrode E1 of the organic light emitting element (OLED), and supplies the driving power corresponding to the data signal to the organic light emitting element (OLED) from the first power ELVDD (not shown) during a light emitting period of the pixel PE. That is, the first thin film transistor T1 functions as a driving transistor of the pixel PE. The first gate electrode G1 of the first thin film transistor T1 is respectively connected to the first capacitor electrode CE1 of the first capacitor C1, the second capacitor C2, the third thin film transistor T3 and the fourth thin film transistor T4, the source electrode (not shown) of the first thin film transistor T1 is respectively connected to the second thin film transistor T2 and the fifth thin film transistor T5, and the drain electrode (not shown) is respectively connected to the third thin film transistor T3 and the sixth thin film transistor T6. The first electrode E1 of the organic light emitting element (OLED) is connected to the first thin film transistor T1 through the sixth thin film transistor T6.

The first thin film transistor T1 includes an amorphous silicon channel region CA1 positioned corresponding to the first gate electrode G1 via the first insulation layer IL1 between the source electrode (not shown) and the drain electrode (not shown). The amorphous silicon channel region CA1 is formed of amorphous silicon (a-Si). The amorphous silicon channel region CA1 is positioned with the same layer as the second polysilicon channel region CA2, the third polysilicon channel region CA3, the fourth polysilicon channel region CA4, the fifth polysilicon channel region CA5, and the sixth polysilicon channel region CA6 that will be described later.

The amorphous silicon channel region CA1 may be formed by crystallizing a portion where the second polysilicon channel region CA2, the third polysilicon channel region CA3, the fourth polysilicon channel region CA4, the fifth polysilicon channel region CA5, and the sixth polysilicon channel region CA6 will be formed excluding the amorphous silicon channel region CA1 in an amorphous silicon pattern formed of one pattern, or may be formed by a different additional process such as chemical vapor deposition from a process forming the second polysilicon channel region CA2, the third polysilicon channel region CA3, the fourth polysilicon channel region CA4, the fifth polysilicon channel region CA5, and the sixth polysilicon channel region CA6 at a portion where only the amorphous silicon channel region CA1 is formed.

The second thin film transistor T2 connects the data line DAm and the first thin film transistor T1, and includes the second gate electrode G2 connected to the second scan line SCn. When the scan signal is supplied from the second scan line SCn, the second thin film transistor T2 transmits the data signal supplied from the data line DAm in the pixel PE. That is, the second thin film transistor T2 functions as a switching transistor of the pixel PE.

The second thin film transistor T2 includes the second polysilicon channel region CA2 positioned corresponding to the second gate electrode G2 via the first insulation layer IL1 between the source electrode and the drain electrode. The second polysilicon channel region CA2 is formed of the polysilicon (poly Si).

The third thin film transistor T3 connects the first thin film transistor T1 and the first gate electrode G1, and includes the third gate electrode G3 connected to the second scan line SCn. When the data signal is supplied in the pixel PE, the third thin film transistor T3 diode-connects the first thin film transistor T1 to compensate the threshold voltage of the first thin film transistor T1. That is, the third thin film transistor T3 functions as the compensation transistor of the pixel PE.

The third thin film transistor T3 includes the third polysilicon channel region CA3 positioned by corresponding to the third gate electrode G3 via the first insulation layer IL1 between the source electrode (not shown) and the drain electrode (not shown). The third polysilicon channel region CA3 is formed of the polysilicon (poly Si).

The fourth thin film transistor T4 connects the initialization power line Vinit and the first gate electrode G1 of the first thin film transistor T1 and includes the fourth gate electrode G4 connected to the first scan line SCn-1. The fourth thin film transistor T4 transmits the initialization power supplied from the initialization power line Vinit in the pixel PE to initialize the first thin film transistor T1 when the scan signal is supplied from the first scan line SCn-1 during the initialization period prior to a data programming period in which the data signal is input to the pixel PE such that the data signal is smoothly supplied in the pixel PE during the data programming period.

That is, the fourth thin film transistor T4 functions as a switching transistor of the pixel PE.

The fourth thin film transistor T4 includes the fourth polysilicon channel region CA4 positioned corresponding to the fourth gate electrode G4 via the first insulation layer IL1 between the source electrode (not shown) and the drain electrode (not shown). The fourth polysilicon channel region CA4 is formed of the polysilicon (poly Si).

The fifth thin film transistor T5 connects the driving power line ELVDDL and the first thin film transistor T1, and includes the fifth gate electrode G5 connected to the light emission control line En. The fifth thin film transistor T5 disconnects the connection between the driving power line ELVDDL connected to the first power ELVDD (not shown) and the first thin film transistor T1 during the non-light emitting period of the pixel PE, and connects the driving power line ELVDDL and the first thin film transistor T1 during the light emitting period of the pixel PE. That is, the fifth thin film transistor T5 functions as a switching transistor of the pixel PE.

The fifth thin film transistor T5 includes the fifth polysilicon channel region CA5 positioned corresponding to the fifth gate electrode G5 via the first insulation layer IL1 between the source electrode (not shown) and the drain electrode (not shown). The fifth polysilicon channel region CA5 is formed of the polysilicon (poly Si).

The sixth thin film transistor T6 connects the first thin film transistor T1 and the first electrode E1 of the organic light emitting element (OLED), and includes the sixth gate electrode G6 connected to the light emission control line En. The sixth thin film transistor T6 disconnects the connection between the first thin film transistor T1 and the organic light emitting element (OLED) during the non-light emitting period of the pixel PE, and connects the first thin film transistor T1 and the organic light emitting element (OLED) during the light emitting period of the pixel PE. That is, the sixth thin film transistor T6 functions as the switching transistor of the pixel PE.

The sixth thin film transistor T6 includes the sixth polysilicon channel region CA6 positioned by corresponding to the sixth gate electrode G6 via the first insulation layer IL1 between the source electrode (not shown) and the drain electrode (not shown). The sixth polysilicon channel region CA6 is formed of the polysilicon (poly Si).

Also, the first gate electrode G1, the second gate electrode G2, the third gate electrode G3, the fourth gate electrode G4, the fifth gate electrode G5, and the sixth gate electrode G6 are positioned within the same layer, and may be simultaneously formed with the gate wires GW by using one process such as photolithography when forming the gate wires GW.

The first capacitor C1 stores the data signal supplied in the pixel PE during the data programming period and maintains the stored data signal during one frame, and is formed between the driving power line ELVDDL connected to the first power ELVDD (not shown) and the first gate electrode G1 of the first thin film transistor T1 connected to the initialization power line Vinit. That is, the first capacitor C1 functions a storage capacitor.

The first capacitor C1 is positioned on the substrate SUB, and includes the first capacitor electrode CE1 and the second capacitor electrode CE2 facing each other via the first insulation layer IL1.

The first capacitor electrode CE1 is connected to the initialization power line Vinit through the fourth thin film transistor T4, and the amorphous silicon channel region CA1 and the second polysilicon channel region CA2 to the sixth polysilicon channel region CA6 are positioned with the same layer.

The second capacitor electrode CE2 is connected to the driving power line ELVDDL and is positioned with same layer as the gate wires GW. The second capacitor electrode CE2 transverses the neighboring pixel PE and extends in the first direction as shown in FIG. 1.

The second capacitor C2 to compensate a voltage drop due to a load in the organic light emitting diode (OLED) display 1000 is formed between the first capacitor electrode CE1 of the first capacitor C1 and the second scan line SCn. That is, the second capacitor C2 increases the voltage of the first gate electrode G1 of the first thin film transistor T1 by the coupling operation when the voltage level of the current scan signal is changed, and particularly the supply of the current scan signal is stopped, thereby functioning as a boosting capacitor compensating the voltage drop due to the load in the organic light emitting diode (OLED) display 1000.

Next, an operation of the described above pixel PE will be described.

First, a previous scan signal of a low level is supplied through the first scan line SCn-1 during a first period that is set as the initialization period. Then, the fourth thin film transistor T4 is turned on corresponding to the previous scan signal of a low level, and initialization power is supplied to the first thin film transistor T1 through the fourth thin film transistor T4 from the initialization power line Vinit such that the first thin film transistor T1 is initialized.

Next, the current scan signal of a low level is supplied through the first scan signal SCn during a second period set as the data programming period. Then, the second thin film transistor T2 and the third thin film transistor T3 are turned on corresponding to the low-level present scan signal.

The first thin film transistor T1 is turned on by being diode-connected by the third thin film transistor T3, and particularly, the first thin film transistor T1 is diode-connected in a forward direction because the first thin film transistor T1 is initialized during the first period.

Thus, the data signal supplied from the data line DAm flows via the second thin film transistor T2, the first thin film transistor T1, and the third thin film transistor T3, and accordingly, a voltage corresponding to a difference between the data signal and the threshold voltage of the first thin film transistor T1 is stored in the first capacitor C1.

Next, when the voltage level of the present scan signal is changed to a high level while the supply of the present scan signal is blocked, a voltage applied to the first gate electrode G1 of the first thin film transistor T1 is changed corresponding to a voltage change range of the present scan signal due to coupling of the second capacitor C2. In this case, since the voltage applied to the first gate electrode G1 of the first thin film transistor T1 is changed by charge sharing between the first capacitor C1 and the second capacitor C2, a change amount of the voltage applied to the first gate electrode G1 is changed in proportion to the voltage change width of the present scan signal and the charge sharing value between the first capacitor C1 and the second capacitor C2.

Next, a light emission control signal supplied from the light emission control line En is changed from a high level to a low level during a third period that is set as the light emission period. Then, the fifth thin film transistor T5 and the sixth thin film transistor T6 are turned on by the low-level light emission control signal during the third period. Accordingly, a driving current flows through the driving power line ELVDDL from the first power source ELVDD, via the fifth thin film transistor T5, the first thin film transistor T1, the sixth thin film transistor T6, and the organic light emitting diode (OLED).

The driving current is controlled by the first thin film transistor T1, and thus the first thin film transistor T1 generates a driving current that corresponds to the voltage supplied to the first gate electrode G1 of the first thin film transistor T1. In this case, a voltage to which the threshold voltage of the first thin film transistor T1 is reflected is stored in the first capacitor C1 during the second period, and therefore the threshold voltage of the first transistor T1 is compensated during the third period.

As described above, in the organic light emitting diode (OLED) display 1000 according to the first exemplary embodiment, the second thin film transistor T2 to the sixth thin film transistor respectively include the second polysilicon channel region CA2 to the sixth polysilicon channel region CA6 formed with the polysilicon (poly Si) having the excellent semiconductor characteristic compared with the amorphous silicon (a-Si) such that the load of the driving current flowing in the pixel PE is minimized. Also, in the organic light emitting diode (OLED) display 1000 according to the first exemplary embodiment, the first thin film transistor T1 controlling the driving current supplied to the organic light emitting element (OLED) substantially includes the amorphous silicon channel region CA1 of the amorphous silicon (a-Si) having a poor semiconductor characteristic compared with the polysilicon (poly Si), and when the light emitted from the organic emission layer (OL) of the organic light emitting element (OLED) according to the driving current flowing in the organic light emitting element (OLED) is displayed as a black color and a white color, the driving range of the gate voltage applied to the first gate electrode G1 of the first thin film transistor T1 has a wide range.

That is, the organic light emitting diode (OLED) display 1000 according to the first exemplary embodiment minimizes the load of the driving current passing through the second thin film transistor T2 to the sixth thin film transistor T6, and simultaneously the driving range (DR) of the first thin film transistor T1 is increased, and accordingly, light emitted from the organic light emitting diode OLED can be controlled to have sufficient grays by changing the gate voltage applied to the first gate electrode G1 of the first thin film transistor T1.

Recently, the pixels per inch (ppi) of the organic light emitting diode (OLED) display 1000 have increased such that the high driving range is required for the light emitted from the organic light emitting element (OLED) to have sufficient grays for realizing the organic light emitting diode (OLED) display 1000 of the high resolution, and accordingly, the organic light emitting diode (OLED) of the organic light emitting diode (OLED) display 1000 according to the first exemplary embodiment is controlled to have sufficient grays, thereby providing the organic light emitting diode (OLED) display 1000 having the high resolution and simultaneously the improved display quality. Also, in the organic light emitting diode (OLED) display 1000 according to the first exemplary embodiment, the semiconductor characteristic of the amorphous silicon channel region CA1 of the first thin film transistor T1 is poor since the first thin film transistor T1 requires the high threshold voltage compared with the second thin film transistor T2 to the sixth thin film transistor T6, and the undesired light emitting of the organic light emitting element (OLED) is suppressed in the low grayscale region such that spots generated in the image displayed by the organic light emitting element (OLED) are minimized.

Also, in the organic light emitting diode (OLED) display 1000 according to the first exemplary embodiment, the second polysilicon channel region CA2 to the sixth polysilicon channel region CA6 of the second thin film transistor T2 to the sixth thin film transistor T6 as the rest of the thin film transistors except for the driving thin film transistor among the first thin film transistor T1, the second thin film transistor T2, the third thin film transistor T3, the fourth thin film transistor T4, the fifth thin film transistor T5, and the sixth thin film transistor T6 of a plurality of thin film transistors are formed of the polysilicon with the improved semiconductor characteristic compared with the amorphous silicon such that each charge mobility of the second thin film transistor T2 to the sixth thin film transistor T6 is increased, and simultaneously the threshold voltage is decreased, thereby the second thin film transistor T2 to the sixth thin film transistor T6 may perform the turn-on and the turn-off with the fast speed. Therefore, the load of the current flowing in the entire organic light emitting diode (OLED) display 1000 is minimized such that the display quality of the image displayed by the organic light emitting diode (OLED) display 1000 is improved. That is, the organic light emitting diode (OLED) display 1000 having the high resolution and simultaneously the improved display quality is provided.

Next, an organic light emitting diode (OLED) display according to the second exemplary embodiment will be described with reference to FIG. 4 to FIG. 6.

Only characteristic parts discriminated from the first embedment will be described and parts whose description is omitted follow the first embodiment. In explaining the second embodiment, the same reference numerals as those of the first embodiment are used for the same elements for the sake of explanation.

Figure 4:
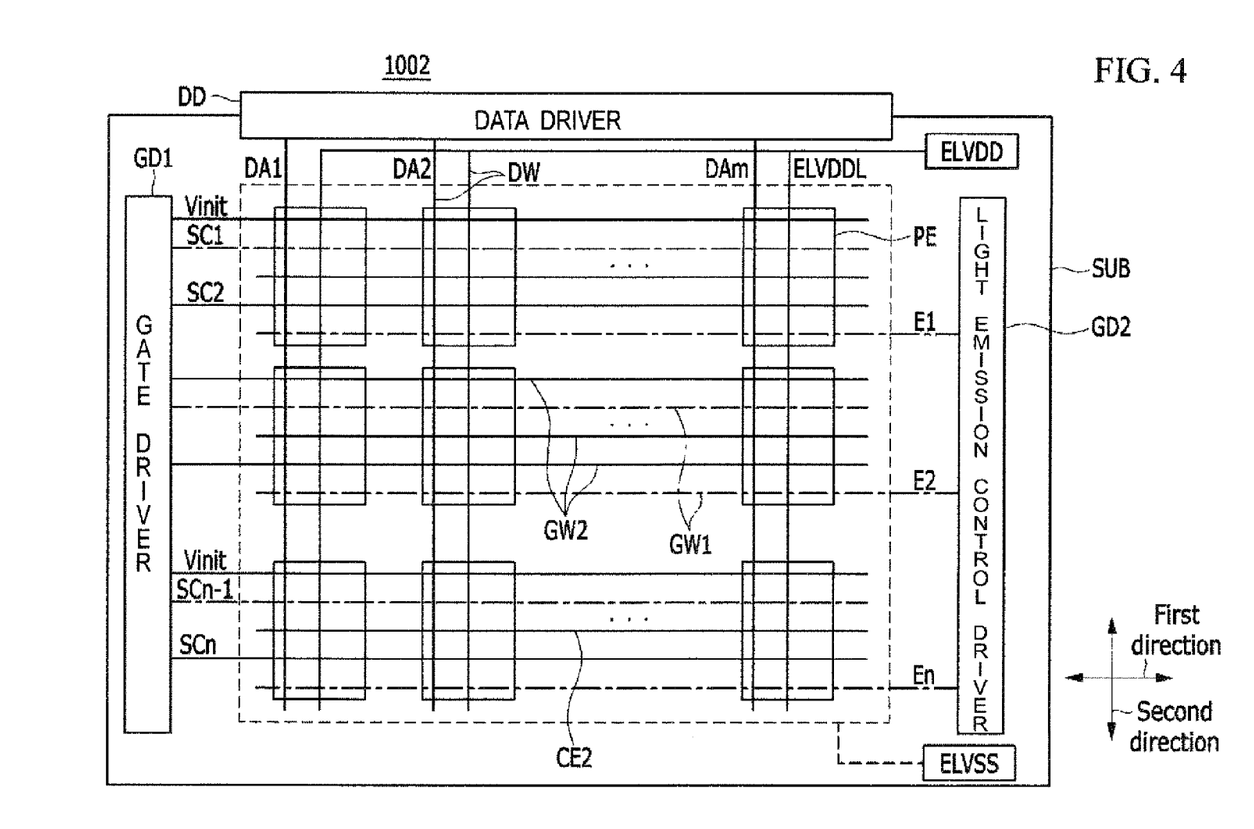
FIG. 4 is a view of an organic light emitting diode (OLED) display according to a second exemplary embodiment.

FIG. 4 is a view of an organic light emitting diode (OLED) display according to the second exemplary embodiment.

As shown in FIG. 4, the organic light emitting diode (OLED) display 1002 according to the second exemplary embodiment includes a gate driver GD1, first gate wires GW1, second gate wires GW2, a light emission control driver GD2, a data driver DD, data wires DW, and pixels PE. The first gate wires GW1 are disposed on a substrate SUB and extended in a first direction. The first gate wires GW1 include the first scan lines SC1 through SCn-1 and the light emission control lines E1 through En. The first scan lines SC1 through SCn-1 are connected to the gate driver GD1 and receive scan signals from the gate driver GD1. The light emission control lines E1 through En are connected to the light emission control driver GD2 and receive light emission control signals from the light emission control driver GD2.

The second gate wires GW2 are disposed on the substrate SUB and extended in a first direction. The second gate wires GW2 include the second scan lines SC2 through SCn, the initialization power lines Vinit, and the second capacitor electrodes CE2.

The first gate wires GW1 and the second gate wires GW2 are non-overlapping. That is, the first gate wires GW1 and the second gate wires GW2 do not overlap.

Figure 6:
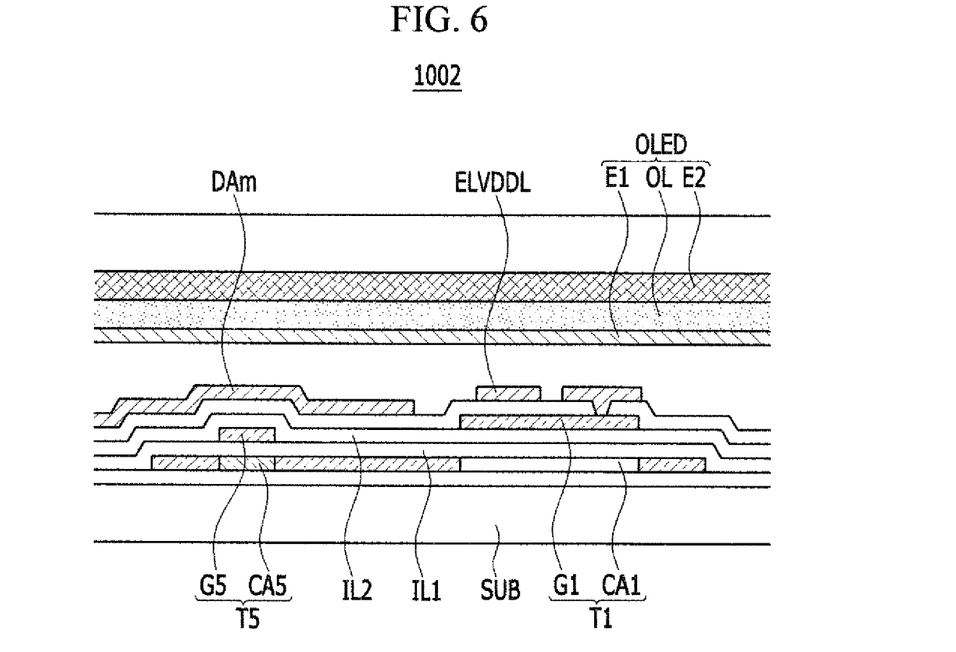
FIG. 6 is a cross-sectional view taken along the line VI-VI of FIG. 5.

As described above, the initialization power lines Vinit, the first scan lines SC1 to SCn-1, the second capacitor electrodes CE2, the second scan lines SC1 to SCn, and the light emission control lines E1 to En are separated from each other and extend in the first direction, the first scan lines SC1 to SCn-1 and light emission control lines E1 to En are positioned with the same layer, and the second scan lines SC2 to SCn and the initialization power lines Vinit are positioned with a different layer via a second insulation layer IL2 (FIG. 6).

In the organic light emitting diode (OLED) display 1002 according to the second exemplary embodiment, the first gate wires GW1 including the first scan lines SC1 to SCn-1 and the light emission control lines E1 to En and the second gate wires GW2 including the second scan lines SC2 to SCn and initialization power lines Vinit are not formed with the same layer as the gate wires that do not overlap and transverse the pixel PE in the first direction, but the first gate wires GW1 and the second gate wires GW2 as the gate wires are positioned with the different layers via the second insulation layer IL2 (FIG. 6) that will be described, thereby decreasing a distance between the neighboring gate wires that are positioned with the different layers, and resultantly, a greater number of pixels PE can be formed in the same area. That is, the high-resolution organic light emitting diode (OLED) display 1002 can be formed.

In addition, each second capacitor electrode CE2 shown in FIG. 4 represents an electrode for configuring a first capacitor C1, and when the second capacitor electrode CE2 is extended in the first direction if needed, the second capacitor electrode CE2 is formed on the same layer as the second gate wires GW2 to make the distance (W) between the neighboring gate wires narrow and form the high-resolution organic light emitting diode (OLED) display 1002.

Figure 5:
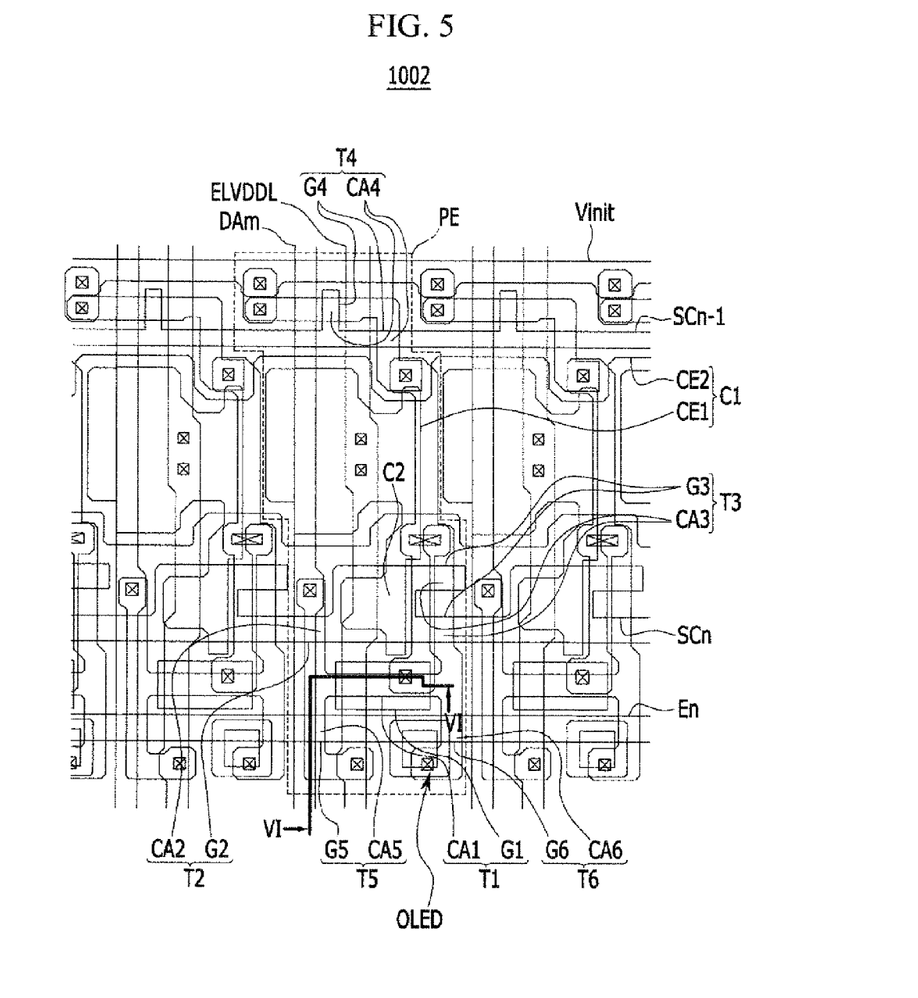
FIG. 5 is a layout view of a pixel portion shown in FIG. 4.

FIG. 5 is a layout view of a pixel portion shown in FIG. 4. FIG. 6 is a cross-sectional view taken along the line VI-VI of FIG. 5.

As shown in FIG. 5 and FIG. 6, the fourth gate electrode G4 of the fourth thin film transistor T4, the fifth gate electrode G5 of the fifth thin film transistor T5, and the sixth gate electrode G6 of the sixth thin film transistor T6 are formed with the same layer, and the first gate electrode G1 of the first thin film transistor T1, the second gate electrode G2 of the second thin film transistor T2, and the third gate electrode G3 of the third thin film transistor T3 are formed with different layers positioned on the fourth gate electrode G4, the fifth gate electrode G5, and the sixth gate electrode G6 via the second insulation layer IL2.

The fourth gate electrode G4, the fifth gate electrode G5, and the sixth gate electrode G6 may be simultaneously formed with the first gate wires GW1 by using one process such as photolithography forming the first gate wires GW1, and the first gate electrode G1, the second gate electrode G2, and the third gate electrode G3 may be simultaneously formed with the second gate wires GW2 by using one process such as photolithography forming the second gate wires GW2.

The first insulation layer IL1 and the second insulation layer IL2 are positioned between the first gate electrode G1 and the amorphous silicon channel region CA1 of the first thin film transistor T1, and the first insulation layer IL1 is only positioned between the fourth gate electrode G4, the fifth gate electrode G5, and the sixth gate electrode G6, and the fourth polysilicon channel region CA4, the fifth polysilicon channel region CA5, and the sixth polysilicon channel region CA6, and thereby a distance between the first gate electrode G1 of the first thin film transistor T1 and the amorphous silicon channel region CA1 is longer than a distance between the fourth gate electrode G4, the fifth gate electrode G5, and the sixth gate electrode G6, and the fourth polysilicon channel region CA4, the fifth polysilicon channel region CA5, and the sixth polysilicon channel region CA6.

The first capacitor electrode CE1 of the first capacitor C1 is positioned at the same layer as the fourth gate electrode G4, the fifth gate electrode G5, and the sixth gate electrode G6 with the same material, and the second capacitor electrode CE2 is positioned at the same layer as the first gate electrode G1, the second gate electrode G2, and the third gate electrode G3 with the same material.

As described above, in the organic light emitting diode (OLED) display 1002 according to the second exemplary embodiment, the second thin film transistor T2 to the sixth thin film transistor T6 respectively include the second polysilicon channel region CA2 to the sixth polysilicon channel region CA6 formed with the polysilicon (poly Si) having the excellent semiconductor characteristic compared with the amorphous silicon (a-Si) such that the load of the driving current flowing in the pixel PE is minimized. Also, in the organic light emitting diode (OLED) display 1002 according to the second exemplary embodiment, the first thin film transistor T1 controlling the driving current supplied to the organic light emitting element (OLED) substantially includes the amorphous silicon channel region CA1 of the amorphous silicon (a-Si) having the poor semiconductor characteristic compared with the polysilicon (poly Si), and when the light emitted from the organic emission layer (OL) of the organic light emitting element (OLED) according to the driving current flowing in the organic light emitting element (OLED) is displayed as a black color and a white color, the driving range (DR) of the gate voltage applied to the first gate electrode G1 of the first thin film transistor T1 is increased.

That is, the organic light emitting diode (OLED) display 1002 according to the second exemplary embodiment minimizes the load of the driving current passing through the second thin film transistor T2 to the sixth thin film transistor T6, and simultaneously the driving range of the first thin film transistor T1 is increased, and accordingly, light emitted from the organic light emitting diode OLED can be controlled to have sufficient grays by changing the gate voltage applied to the first gate electrode G1 of the first thin film transistor T1.

Also, in the organic light emitting diode (OLED) display 1002 according to the second exemplary embodiment, first insulation layer IL1 and the second insulation layer IL2 are positioned between the amorphous silicon channel region CA1 and the first gate electrode G1 of the first thin film transistor T1 of the driving thin film transistor such that the first thin film transistor T1 includes a gate insulating layer compared with the fourth thin film transistor T4, the fifth thin film transistor T5, and the sixth thin film transistor T6, and when the light emitted from the organic light emitting element (OLED) according to the driving current flowing in the organic light emitting element (OLED) displays the black color and the white color, the gate voltage applied to the first gate electrode G1 of the first thin film transistor T1 has the wide driving range. As described above, in the organic light emitting diode (OLED) display 1002 according to the second exemplary embodiment, the driving range of the first thin film transistor T1 as the driving thin film transistor is increased, and accordingly, light emitted from the organic light emitting diode OLED can be controlled to have sufficient grays by changing the gate voltage applied to the first gate electrode G1. That is, the organic light emitting diode (OLED) display 1002 with the improved display quality is provided.

Also, in the organic light emitting diode (OLED) display 1002 according to the second exemplary embodiment, the fourth thin film transistor T4 to the sixth thin film transistor T6 of the rest of the switching thin film transistors except for the first thin film transistor T1 to the third thin film transistor T3 among the first thin film transistor T1, the second thin film transistor T2, the third thin film transistor T3, the fourth thin film transistor T4, the fifth thin film transistor T5, and the sixth thin film transistor T6 of a plurality of thin film transistors are positioned with the same layer as the first gate wires GW1, and thereby the first insulation layer IL1 is only positioned between the fourth gate electrode G4, the fifth gate electrode G5, and the sixth gate electrode G6, and the fourth polysilicon channel region CA4, the fifth polysilicon channel region CA5, and the sixth polysilicon channel region CA6, and accordingly each charge mobility of the fourth thin film transistor T4, the fifth thin film transistor T5, and the sixth thin film transistor T6 as the switching thin film transistors is increased and simultaneously the threshold voltage is decreased, resultantly the fourth thin film transistor T4, the fifth thin film transistor T5, and the sixth thin film transistor T6 may perform the turn-on and the turn-off with the fast speed. Accordingly, the load of the current flowing into the OLED display 1002 is minimized so that image quality of an image displayed in the OLED display 1002 can be improved. That is, the OLED display 1002 having high resolution and improved image quality can be provided.

Also, in the organic light emitting diode (OLED) display 1002 according to the second exemplary embodiment, the first capacitor electrode CE1 as one electrode of the first capacitor C1 is formed with the same layer as the first gate wires GW1, and the second capacitor electrode CE2 as the other electrode of the first capacitor C1 is formed with the same layer as the second gate wires GW2, and accordingly, since the first capacitor C1 does not need to include the polysilicon with irregular intensity of surface illumination, the capacitance is not undesirably transformed by undesired surface transformation of the electrode. That is, each of the first capacitor C1 and the second capacitor C2 can store exact capacitance according to the initial design, and accordingly the driving current controlled by the first thin film transistor T1 can be accurately controlled, thereby suppressing deterioration of display quality. That is, the OLED display 1002 having high resolution and improved display quality can be provided.

Further, in the organic light emitting diode (OLED) display 1002 according to the second exemplary embodiment, the single second insulation layer IL2 is only positioned between the first capacitor electrode CE1 and the second capacitor electrode CE2 of the first capacitor C1 such that the storage capacitance of the first capacitor C1 may be improved. Therefore, since the area of the first capacitor C1 can be reduced, the high-resolution organic light emitting diode (OLED) display 1000 can be formed in the area.

As described, the gate wires are configured with the first gate wires GW1 and the second gate wires GW2 at different layers from each other, the gate electrode G1 of the first thin film transistor T1 that is the drive thin film transistor is provided on the same layer as the second gate wires GW2 to have a thick insulation layer, the fourth gate electrode G4, the fifth gate electrode G5, and the sixth gate electrode G6 of the fourth thin film transistor T4, the fifth thin film transistor T5, and the sixth thin film transistor T6 that are the switching thin film transistors are provided on the same layer as the first gate wires GW1 to have a thin insulation layer, the first thin film transistor T1 includes the amorphous silicon channel region CA1, the second thin film transistor T2 to the sixth thin film transistor T6 respectively include the second polysilicon channel region CA2 to the sixth polysilicon channel region CA6, and the first capacitor C1 includes one electrode with the same layer as the first gate wires GW1 and the other electrode with the same layer as the second gate wires GW2 so that the first capacitor C1 may have accurate capacitance and may simultaneously have a thin insulation layer, so the organic light emitting diode (OLED) display 1002 can be formed to be a high-resolution organic light emitting diode (OLED) display with improved display quality.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display including:
   a substrate;
   an organic light emitting element formed on the substrate;
   a first thin film transistor providing driving power to the organic light emitting element, the first thin film transistor includes an amorphous silicon channel region; and
   a plurality of other thin film transistors directly connected to the first thin film transistor, each of the plurality of other thin film transistors includes a polysilicon channel region which is directly connected to the amorphous silicon channel region, wherein
   a distance between a first gate electrode and the amorphous silicon channel region of the first thin film transistor being longer than a distance between a gate electrode and the polysilicon channel region of the plurality of other thin film transistors.

2. The organic light emitting diode (OLED) display of claim 1, wherein the amorphous silicon channel region and the polysilicon channel region being positioned at the same layer.

3. The organic light emitting diode (OLED) display of claim 1, further comprising:
   a first scan line extending in a first direction on the substrate;
   a second scan line separated from the first scan line and extending in the first direction;
   an initialization power line separated from the second scan line and extending in the first direction;
   a light emission control line separated from the initialization power line and extending in the first direction;
   a data line extending in a second direction crossing the first direction on the substrate; and
   a driving power line separated from the data line and extending in the second direction.

4. The organic light emitting diode (OLED) display of claim 3, wherein the first scan line, the second scan line, the initialization power line, and the light emission control line being positioned at the same layer.

5. The organic light emitting diode (OLED) display of claim 3, wherein the first scan line and the light emission control line being positioned at the same layer, and the second scan line and the initialization power line being positioned on the first scan line and the light emission control line via an insulation layer.

6. The organic light emitting diode (OLED) display of claim 3, wherein the plurality of other thin film transistors including:
   a second thin film transistor including a second gate electrode connected to the first scan line and connecting the data line and the first thin film transistor;
   a third thin film transistor including a third gate electrode connected to the first scan line and connecting the first thin film transistor and the first gate electrode of the first thin film transistor;
   a fourth thin film transistor including a fourth gate electrode connected to the second scan line and connecting the initialization power line and the first gate electrode;
   a fifth thin film transistor including a fifth gate electrode connected to the light emission control line and connecting the driving power line and the first thin film transistor; and a sixth thin film transistor including a sixth gate electrode connected to the light emission control line and connecting the first thin film transistor and the organic light emitting element.

7. The organic light emitting diode (OLED) display of claim 6, wherein the first gate electrode, the second gate electrode, the third gate electrode, the fourth gate electrode, the fifth gate electrode, and the sixth gate electrode being formed at the same layer.

8. The organic light emitting diode (OLED) display of claim 6, wherein the fourth gate electrode, the fifth gate electrode, and the sixth gate electrode being positioned at the same layer, and the first gate electrode, the second gate electrode, and the third gate electrode being positioned at different layers on the fourth gate electrode, the fifth gate electrode, and the sixth gate electrode via an insulation layer.

9. The organic light emitting diode (OLED) display of claim 8, further comprising a capacitor including a first capacitor electrode connected to the first gate electrode and positioned at the same layer as the fourth gate electrode, the fifth gate electrode, and the sixth gate electrode, and a second capacitor electrode connected to the driving power line and formed at the same layer as the first gate electrode, the second gate electrode, and the third gate electrode.

10. The organic light emitting diode (OLED) display of claim 1, wherein the organic light emitting element including:
a first electrode connected to the first thin film transistor;
an organic emission layer positioned on the first electrode; and
a second electrode positioned on the organic emission layer.

* * * * *